(12) United States Patent
Park et al.

(10) Patent No.: US 6,794,215 B2
(45) Date of Patent: Sep. 21, 2004

(54) METHOD FOR REDUCING DARK CURRENT IN IMAGE SENSOR

(75) Inventors: Ki-Nam Park, Ichon-shi (KR); Oh-Bong Kwon, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 408 days.

(21) Appl. No.: 09/740,947

(22) Filed: Dec. 21, 2000

(65) Prior Publication Data

US 2001/0023086 A1 Sep. 20, 2001

(30) Foreign Application Priority Data

Dec. 28, 1999 (KR) .......................................... 1999-63985

(51) Int. Cl.[7] .............................................. H01L 21/00
(52) U.S. Cl. ............................ 438/69; 438/48; 438/70; 438/66; 438/237
(58) Field of Search .............................. 438/48, 57, 60, 438/69, 70, 75, 66, 144, 237; 257/233

(56) References Cited

U.S. PATENT DOCUMENTS

| | | | | |
|---|---|---|---|---|
| 4,883,766 A | * | 11/1989 | Ishida et al. ................ | 438/151 |
| 5,317,432 A | * | 5/1994 | Ino .............................. | 349/39 |
| 5,401,685 A | * | 3/1995 | Ha .............................. | 438/162 |
| 5,483,096 A | * | 1/1996 | Kuhara ........................ | 257/462 |
| 5,519,207 A | * | 5/1996 | Morimoto ................. | 250/208.1 |
| 5,534,445 A | * | 7/1996 | Tran et al. ................... | 438/162 |
| 5,674,759 A | * | 10/1997 | Jung ........................... | 438/162 |
| 6,166,405 A | * | 12/2000 | Kuriyama et al. ........... | 257/290 |
| 6,271,054 B1 | * | 8/2001 | Ballantine et al. ............ | 438/60 |
| 6,448,592 B1 | * | 9/2002 | Peek et al. ................... | 257/215 |
| 6,556,257 B2 | * | 4/2003 | Ino .............................. | 349/43 |

FOREIGN PATENT DOCUMENTS

JP           1-152761           6/1989

OTHER PUBLICATIONS

Huang et al. "Improvement in Dark Current Characteristics and Long–Term Stability of Mesa INGAAS/InP pin Photo-diodes with Two–Step SiNx Surface Passivation", Oct. 1991, IEEE, pp. 934–936.*

Korde et al. "One Gigasrad Passivatind Nitride Oxides for 100% Internal Quantum Efficiency Silicon Photodiodes", Dec. 1993, IEEE, pp. 1655–1659.*

* cited by examiner

*Primary Examiner*—Maria Guerrero
(74) *Attorney, Agent, or Firm*—Finnegan, Henderson, Farabow, Garrett & Dunner, L.L.P.

(57) ABSTRACT

A method for fabricating a CMOS image sensor having a characteristic of a reduced dark current includes the steps of: a) providing a semiconductor structure, wherein the semiconductor structure includes a photodiode and peripheral elements formed on a semiconductor substrate; b) forming an insulating layer on the semiconductor structure; c) forming a hydrogen containing dielectric layer on the insulting layer; d) diffusing hydrogen ions contained in the hydrogen containing dielectric layer into a surface of the photodiode, thereby removing a dangling bond; and e) removing the hydrogen containing dielectric layer.

6 Claims, 7 Drawing Sheets

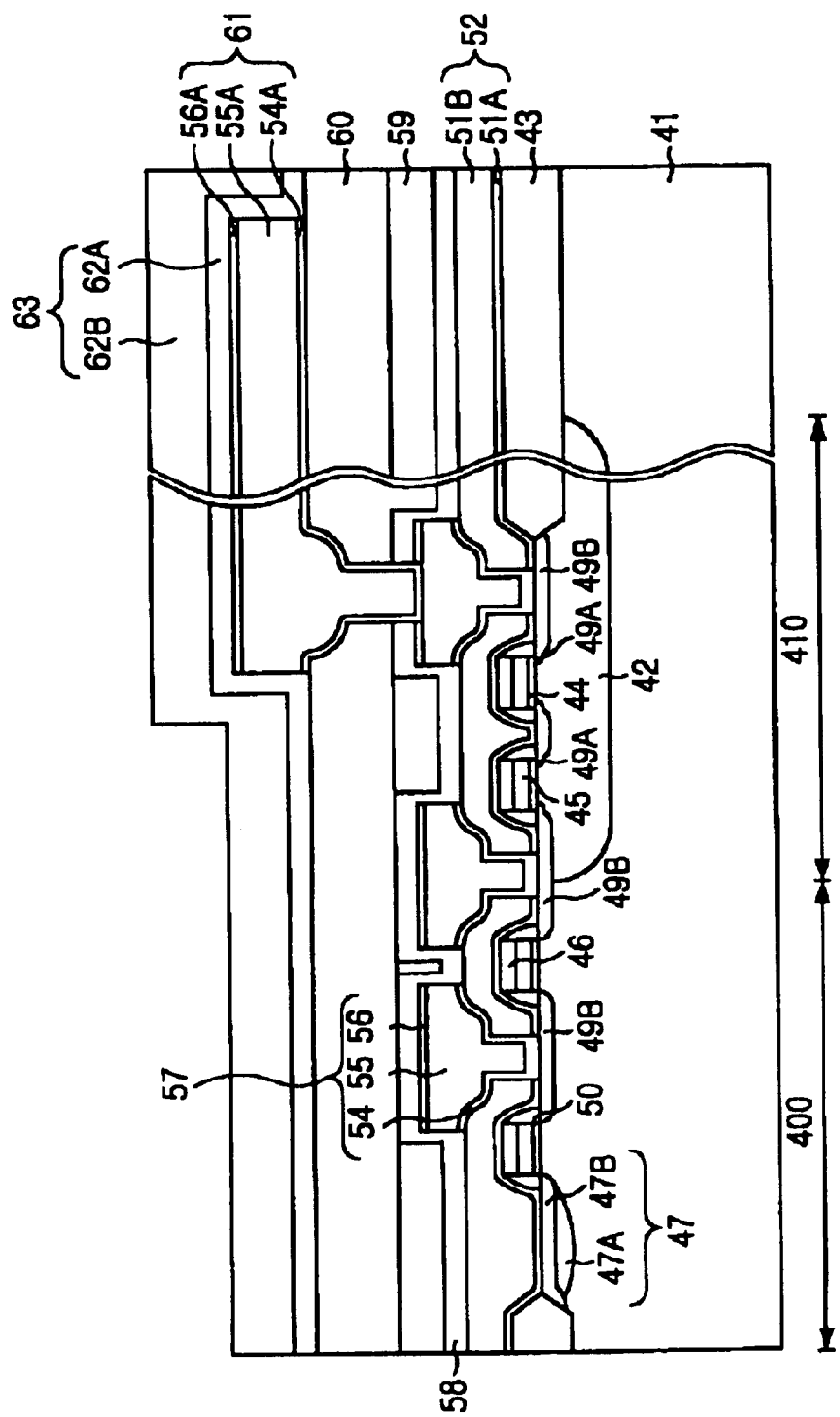

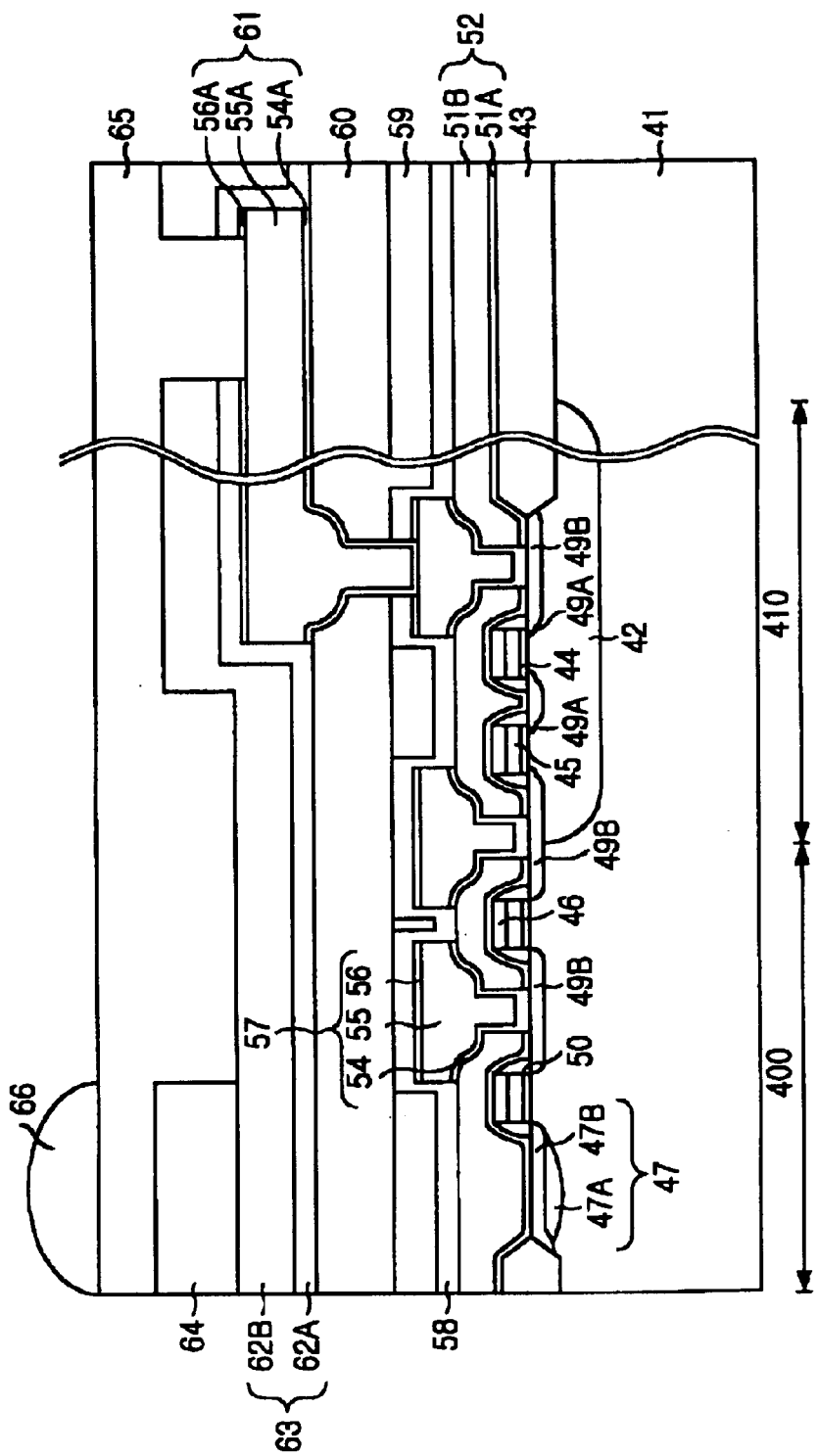

METHOD FOR REDUCING DARK CURRENT IN IMAGE SENSOR

FIELD OF THE INVENTION

The present invention relates to a semiconductor device; more particularly, to a method for fabricating a CMOS image sensor having a plurality of unit pixels which are capable of reducing a dark current.

DESCRIPTION OF THE PRIOR ART

As is well known, an image sensor is an apparatus for sensing a light beam reflected from an object to generate an image data. Especially, an image sensor fabricated by using a complementary metal oxide semiconductor (CMOS) technology is called a CMOS image sensor.

Generally, the CMOS image sensor includes a plurality of unit pixels. Each of the unit pixels also includes a light sensing element and a plurality of transistors. The light sensing element such as a photodiode senses incident light beam to generate photoelectric charges corresponding to an amount of the incident light beam. The transistors perform switching operations to control a transfer of the photoelectric charges.

FIG. 1 is a cross-sectional view showing sequential steps of fabricating a conventional unit pixel contained in a CMOS image sensor.

Referring to FIG. 1, a P-type well 12 and a field oxide layer 13 are formed on a semiconductor substrate 11, and a PN junction region 17A and 17B is formed in the semiconductor substrate 11 to thereby provide a photodiode 17. Then, a floating junction region 18A, to which photoelectric charges generated in the photodiode 17 is transferred, is formed within the semiconductor substrate 11.

Then, a transfer transistor TX for transmitting the photodiode to the floating junction region 18A and a reset transistor RX for resetting the floating junction region 18A are formed on the semiconductor substrate 11. A drive transistor DX for amplifying a voltage level corresponding to the transferred photoelectric charges and a select transistor SX for outputting amplified voltage level as the image data are formed on the P-type well 12. At this time, the reset transistor RX and the drive transistor SX are commonly coupled to a common junction region 18B, and an impurity junction region 19 of a lightly loped drain (DLL) structure is formed between the drive transistor DX and the select transistor SX. Also, spacers 20 are formed on sidewalls of each transistors TX, RX, DX and SX.

Then, pre-metal dielectric (PMD) layers 21 and 22 are formed on the transistors TX, RX, DX and SX, and interlayer insulating layers 23, 24 and 25 are formed on the PMD layer 22.

Then, the PMD layers 21 and 22 and the interlayer insulating layers 23, 24 and 25 are selectively etched and first metal lines M1, M2 and M3 and a second metal line M4 are formed thereon, respectively. The first metal lines M1, M2 and m3 and the second metal line M4 used to connect the transistors TX, RX, DX and SX with an external elements are formed with staked layers of Ti/Al/TiN.

Then, a passivation layer formed with an oxide layer 29 and a nitride layer 30 is formed on the second metal line M4.

Then, a color filter array (CFA) operation is carried out to thereby form a color filter 31, and a dyed photoresist 32 is formed on an entire structure. Then, a microlens 33 is formed above a portion where the color filter 31 is formed.

At this time, a number of surface energy states exist in a forbidden band due to a dangling bond of a lattice structure. The surface energy states result in a recombination of carriers. As a result, a leakage current is increased and a breakdown voltage of the image sensor may be influenced. That is, an undesired dark current is flowed so that a reliability of the image sensor is degraded.

SUMMARY OF THE INVENTION

It is, therefore, an object of the present invention to provide a method for fabricating a CMOS image sensor having a unit pixel which is capable of reducing a dark current.

In accordance with an aspect of the present invention, there is provided a method for fabricating a CMOS image sensor, wherein the CMOS image sensor includes a plurality of unit pixels, the method comprising the steps of: a) providing a semiconductor structure, wherein the semiconductor structure includes a photodiode and peripheral elements formed on a semiconductor substrate; b) forming an insulating layer on the semiconductor structure; c) forming a hydrogen containing dielectric layer on the insulting layer; d) diffusing hydrogen ions contained in the hydrogen containing dielectric layer into a surface of the photodiode, thereby removing a dangling bond; and e) removing the hydrogen containing dielectric layer.

BRIEF DESCRIPTION OF THE DRAWINGS

Other objects and aspects of the invention will become apparent from the following description of the embodiments with reference to the accompanying drawings, in which:

FIGS. 2A, 2B, 2C, 2D, 2E and 2F are cross-sectional views illustrating sequential steps of fabricating a CMOS image sensor in accordance with the present invention.

DETAILED DESCRIPTION OF THE PREFERRED EMBODIMENTS

FIGS. 2A to 2F are cross-sectional views illustrating sequential steps of fabricating a unit pixel in accordance with the present invention.

Figure 1:
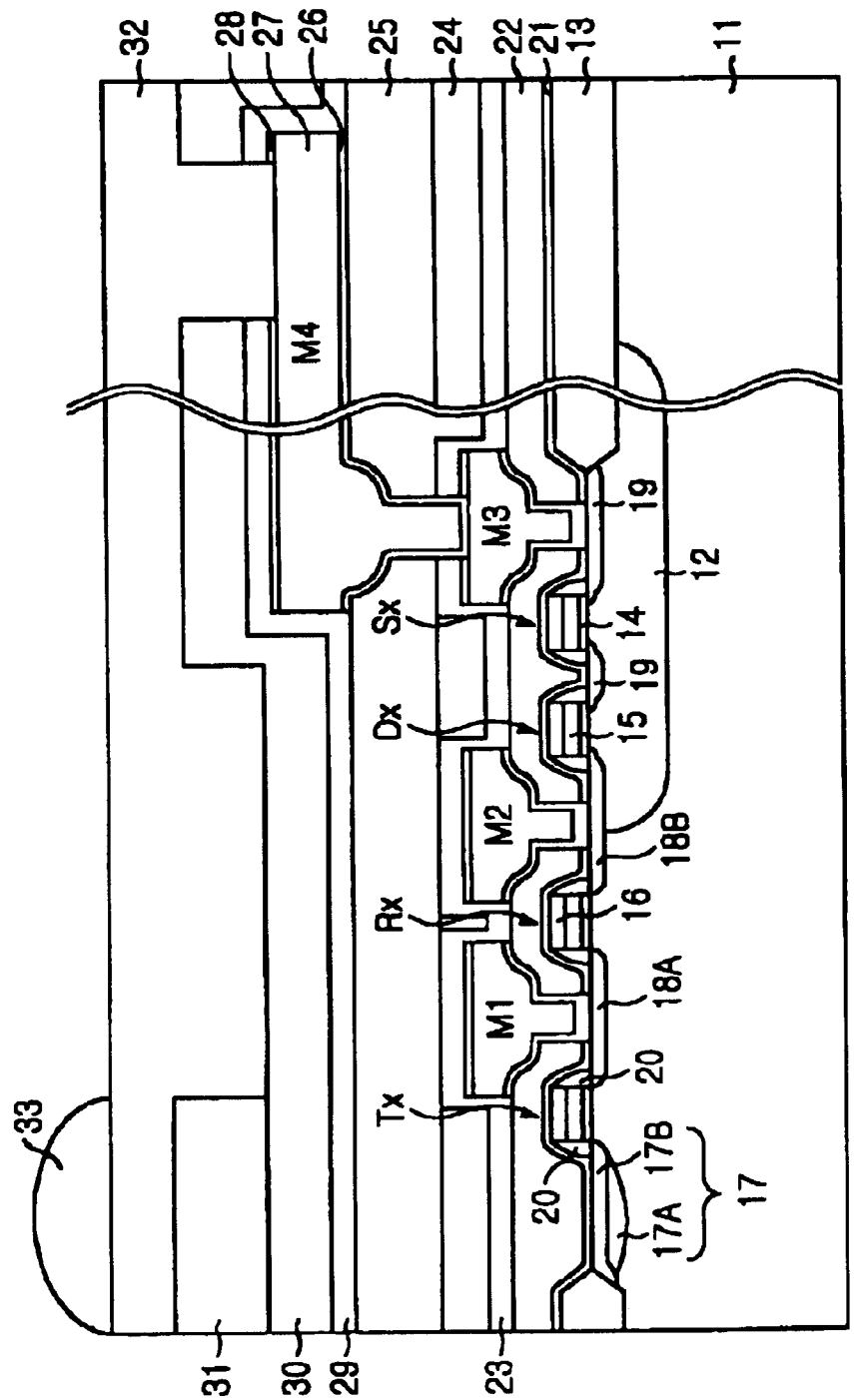
FIG. 1 is a cross-sectional view showing sequential steps of fabricating a conventional CMOS image sensor.
Figure 2A:
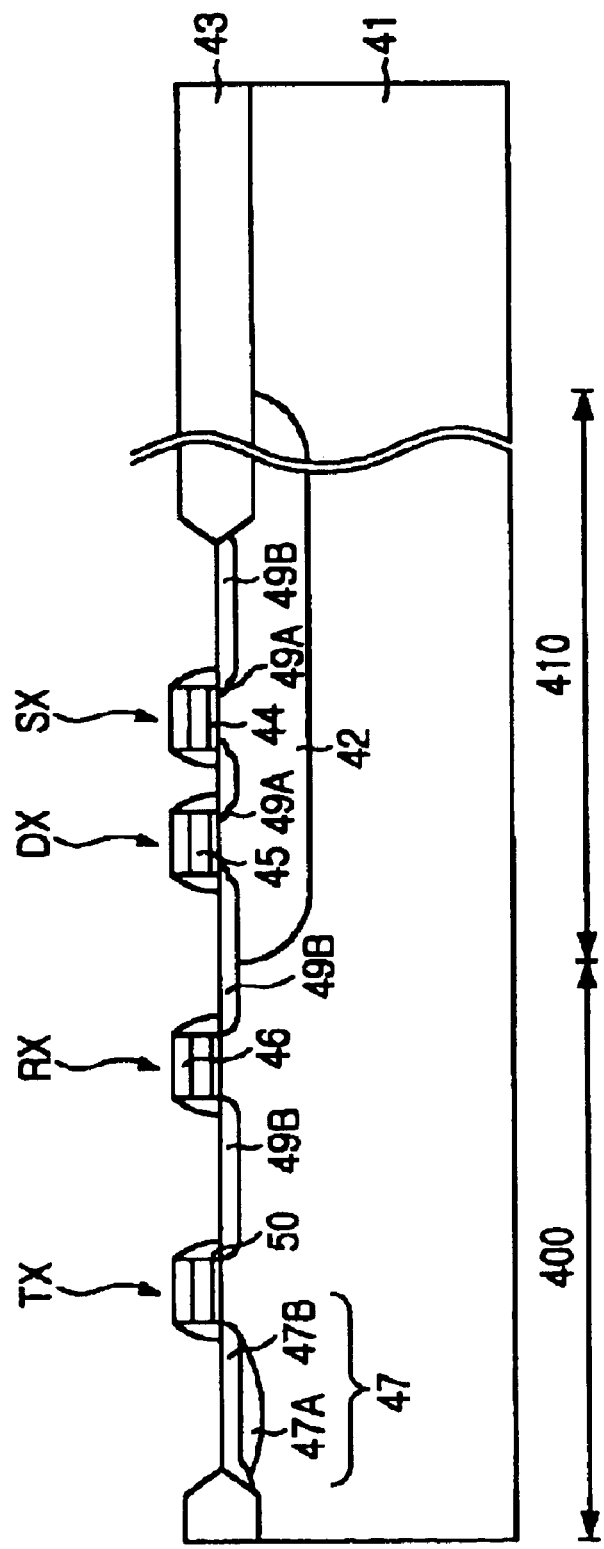

Referring to FIG. 2A, after performing a mask operation for forming a well region, boron ions are implanted and a thermal treatment is carried out to thereby form a P-type well region 42 on a predetermined portion 410 of the semiconductor substrate 41 by a lateral diffusion.

Then, after forming a field oxide layer 43 for isolation between neighboring unit pixels, four transistors TX, RX, DX and SX are formed on the semiconductor substrate 41. Here, each transistors TX, RX, DX and SX includes a gate oxide layer 44, a polysilicon layer 45 and a tungsten silicide layer 46. The transistors TX and RX are formed on a first portion 400 and the transistors DX and SX are formed on the second portion 410.

Then, after performing a mask operation for forming a photodiode 47, implantation of $N^-$ and $P^0$ ions is carried out to thereby form an $N^-$ doping region 47A and a $P^0$ doping region 47B which are self-aligned on one side of the transistor TX. At this time, the P-type semiconductor substrate 41, the $N^-$ doping region 47A and the $P^0$ doping region 47B constitute the photodiode 47 of a PNP structure.

Then, a lightly doped drain (LDD) region 49A is formed beneath the transistors DX and SX by implanting boron ions. Spacers 50 are formed on sidewalls of the transistors TX, RX, DX and SX, and then, impurity junction layers 49B are formed by implanting N-type impurity ions.

Figure 2B:
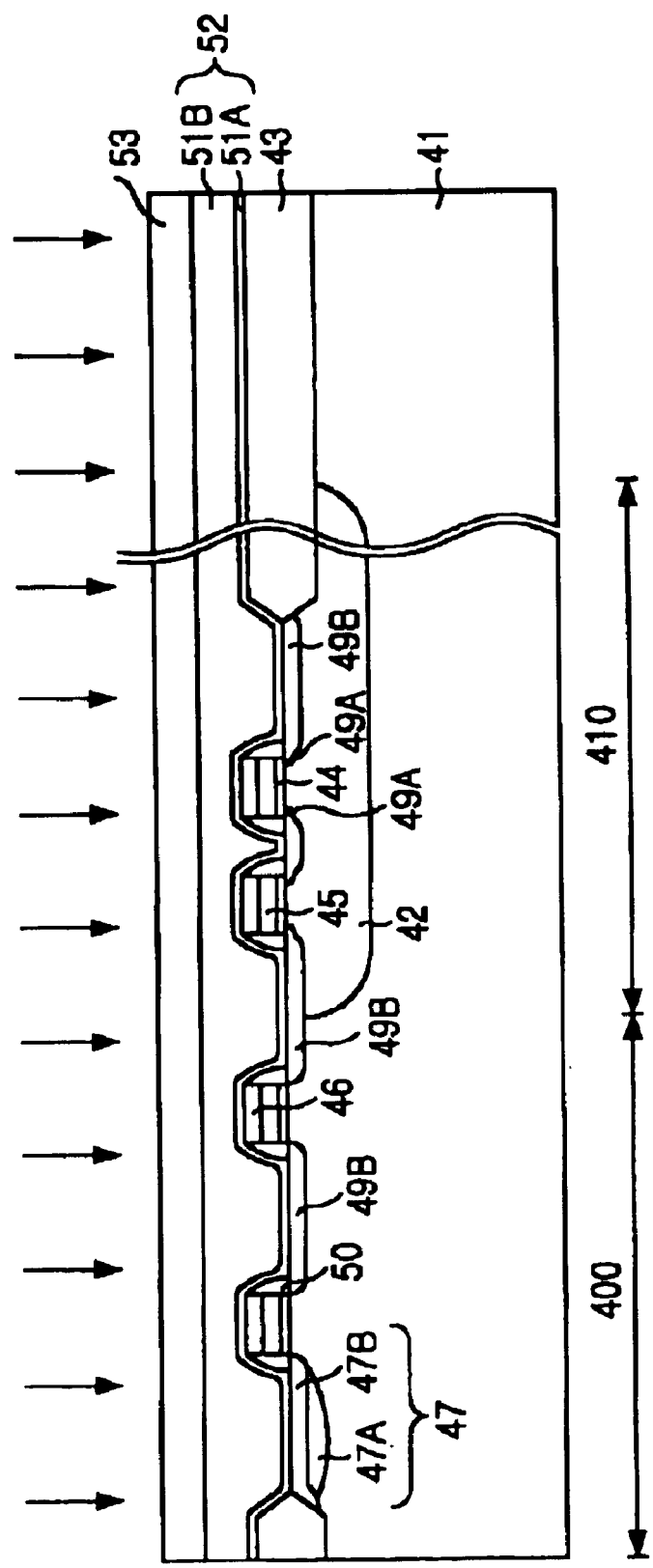

Referring to FIG. 2B, a first tetra-ethyl-ortho-silicate (TEOS) layer 51A is deposited on an entire structure by using a low pressure chemical vapor deposition (LPCVD), and a borophospho-silicate glass (BPSG) layer is deposited on the first TEOS layer 51A by using an atmospheric pressure chemical vapor deposition (APCVD). Thereafter, a thermal treatment is performed to reflow the BPSG layer 51B. Here, a stacked layer of the first TEOS layer 51A and the BPSG layer 51B are called a pre-metal dielectric (PMD) layer 52.

Then, a hydrogen containing dielectric layer 53, whose thickness is a range of 7000 Å to 8000 Å, is formed on the PMD layer 52 by using a plasma enhanced chemical vapor deposition (PECVD). At this time, the hydrogen containing dielectric layer 53 is formed with one of $SiO_x$, $SiN_x$, $SiO_xN_y$, $Si_3N_4$, and the like.

Then, a thermal treatment is carried out to diffuse hydrogen ions contained in the hydrogen containing dielectric layer 53 to a surface of the photodiode 47. Thereafter, a dry etching or wet etching operation is performed to remove the hydrogen containing dielectric layer 53. Here, a hydrogen content in the hydrogen containing dielectric layer 53 is controlled by a degree of vacuum, a temperature and an injection amount of $NH_3/SiH_4$ gases in the process of the PECVD.

Figure 2C:
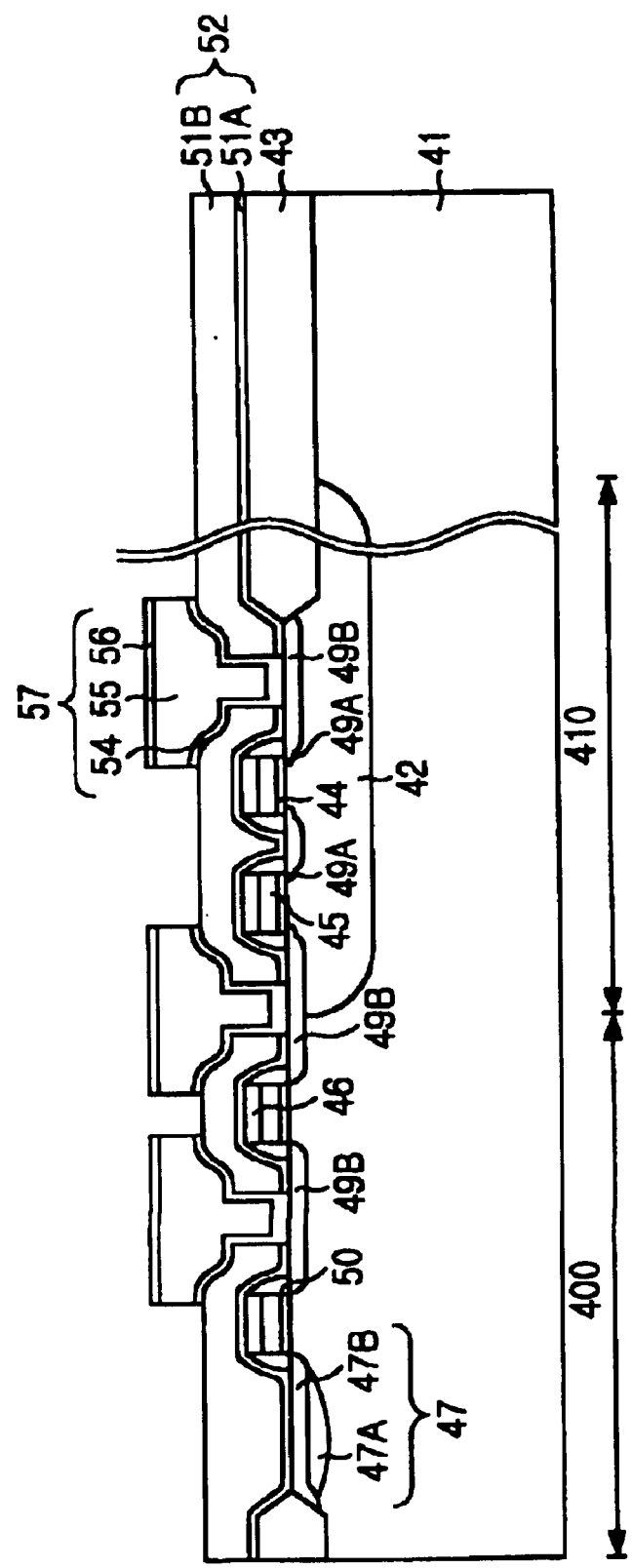

Referring to FIG. 2C, an isotropic etching operation is performed by using a buffered oxide etchant (BOE) to thereby form a contact hole on the impurity junction region 49B. Then, Ti/Al/TiN layers 54, 55 and 56 are sequentially deposited on an entire structure, and a mask operation and an etching operation are carried out to form a first metal line 57.

Figure 2D:
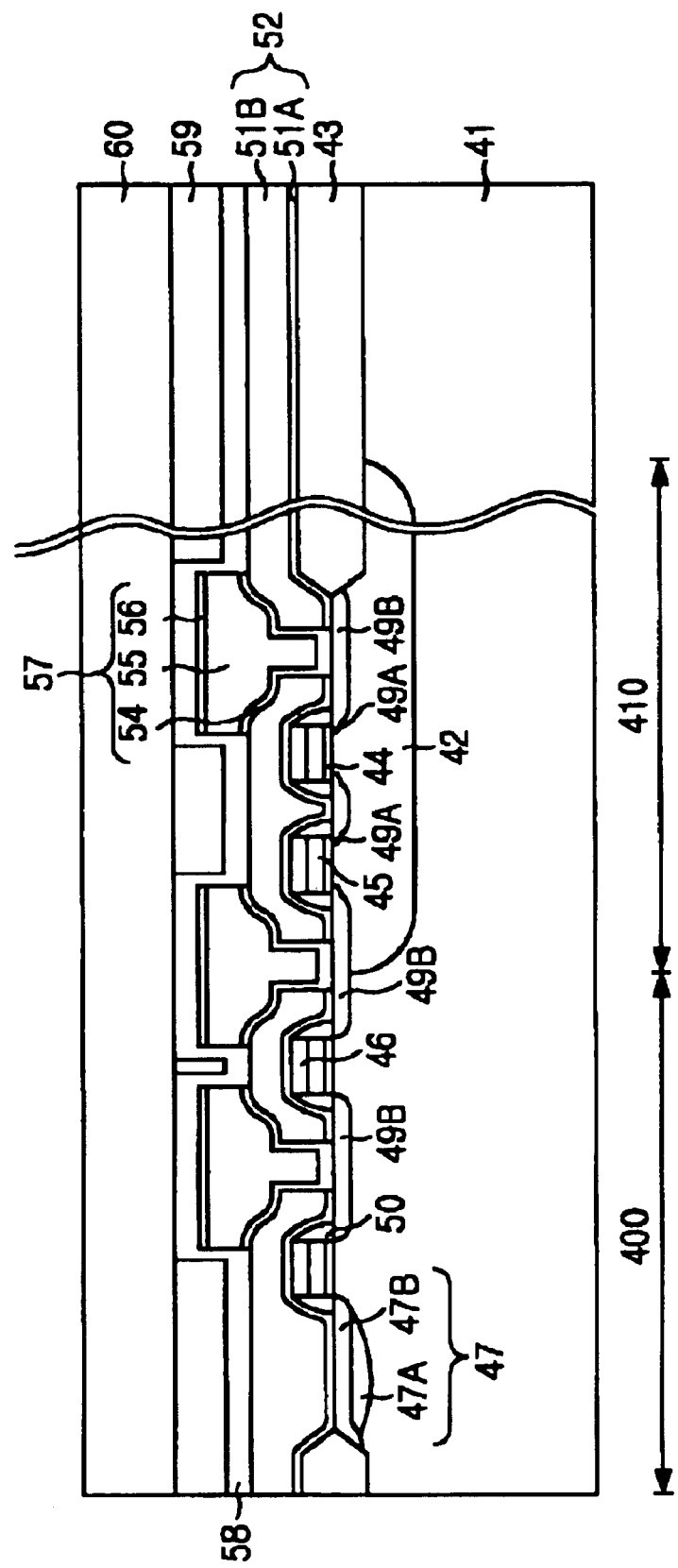

Referring to FIG. 2D, a second TEOS layer 58 is deposited on the first metal line 57 by using the PECVD. A spin on glass (SOG) layer 59 is coated two times and a planarization of the SOG layer 59 is performed through a thermal treatment and a plasma. Then, an interlayer insulating layer 60 is deposited on the SOG layer 59 by using the PECVD.

Referring to FIG. 2E, after performing a mask operation, an isotropic etching operation is carried out by using the BOE, and then, an anisotropic etching operation is carried out to thereby form a contact hole. Then, Ti/Al/TiN layers 54A, 55A and 56A are sequentially deposited on an entire structure, and a mask operation and an etching operation are carried out to form a second metal line 61. Thereafter, an oxide layer 62A and a nitride layer 62B are deposited on the second metal line 61 by using the PECVD.

Referring to FIG. 2F, the nitride layer 62B and the oxide layer 62A are selectively etched to expose a predetermined portion of the second metal line 61. Then, a dyed photoresist is coated on a upper portion of the photodiode 47 and a color filter 64 is formed by using an operation of a development. Then, a microlens photoresist layer 65 is formed and a microlens 66 is formed on the microlens photoresist layer 65.

The dielectric layer 53 containing the hydrogen can be formed above only upper portion of the photodiode 47.

As described above, by diffusing the hydrogen ions contained in the dielectric layer into the surface of the photodiode by using the PECVD, an unstable dangling bond is removed and a recombination of carriers is reduced in the surface of the photodiode, thereby reducing the dark current of the photodiode caused by a leakage current.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a CMOS image sensor having a plurality of unit pixels, comprising:
    a) providing a semiconductor structure having a photodiode on a semiconductor substrate;
    b) forming an insulating layer covering the semiconductor structure including the photodiode;
    c) forming a dielectric layer having hydrogen on the insulting layer above an upper portion of the photodiode;
    d) diffusing hydrogen ions from the dielectric layer into the photodiode;
    e) removing the dielectric layer; and
    f) forming a metal line by sequentially depositing Ti/Al/TiN layers after an isotropic etching operation is carried out on the insulating layer.

2. The method as recited in claim 1, wherein the step of diffusing hydrogen ions includes a thermal treatment.

3. The method as recited in claim 1, wherein the step of removing the dielectric layer includes a dry etching or a wet etching.

4. The method as recited in claim 1, wherein the step of forming a dielectric layer includes depositing it to a thickness of 7000 Å to 8000 Å.

5. The method as recited in claim 1, wherein the step of forming a dielectric layer includes forming it with a material selected from a group consisting of $SiO_x$, $SiN_x$, $SiO_xN_y$, and $Si_3N_4$.

6. The method as recited in claim 5, wherein the step of forming a dielectric layer includes plasma enhanced chemical vapor deposition (PECVD).

* * * * *